United States Patent [19]

Goubau et al.

[11] Patent Number: 5,268,806
[45] Date of Patent: Dec. 7, 1993

[54] MAGNETORESISTIVE TRANSDUCER HAVING TANTALUM LEAD CONDUCTORS

[75] Inventors: Wolfgang M. Goubau, San Jose; James K. Howard, Morgan Hill; Hung-Chang W. Huang, San Jose; Cherngye Hwang, San Jose; Robert O. Schwenker, San Jose; James C. Uy, Morgan Hill, all of Calif.

[73] Assignee: International Business Machines Corporation, Armonk, N.Y.

[21] Appl. No.: 823,522

[22] Filed: Jan. 21, 1992

[51] Int. Cl.$^5$ ............................................. G11B 5/127
[52] U.S. Cl. ....................................................... 360/113
[58] Field of Search ................................. 360/113, 126

[56] References Cited

U.S. PATENT DOCUMENTS

| | | | |
|---|---|---|---|
| 4,503,394 | 3/1985 | Kawakami et al. | 324/252 |
| 4,622,613 | 11/1986 | Nomura et al. | 360/113 |
| 4,663,684 | 5/1987 | Kamo et al. | 360/113 |
| 4,914,538 | 4/1990 | Howard et al. | 360/252 |

Primary Examiner—A. J. Heinz
Attorney, Agent, or Firm—Leslie G. Murray

[57] ABSTRACT

A magnetoresistive (MR) sensor having electrically conductive lead structures which are in electrical contact with the MR element at spaced positions. The lead structures comprise a thin film layer of body-centered-cubic tantalum which is separated from the MR element by a thin film seed layer formed of a material taken from the group consisting of TiW, TaW, Cr and W.

8 Claims, 2 Drawing Sheets

MAGNETORESISTIVE TRANSDUCER HAVING TANTALUM LEAD CONDUCTORS

BACKGROUND OF THE INVENTION

1. Field of the Invention

This invention relates in general to magnetic transducers for reading information signals from a magnetic medium, and in particular, to an improved magnetoresistive read transducer.

2. Description of the Prior Art

The prior art discloses a magnetic transducer referred to as magnetoresistive (MR) sensor or head which has been shown to be capable of reading data from a magnetic surface at high linear densities. An MR sensor detects magnetic field signals through the resistance changes of a read element made from a magnetoresistive material as a function of the amount and direction of magnetic flux being sensed by the element.

In the past, principal problems with the MR sensors of unstable operating characteristics have limited their use. One of the sources of unstable operating characteristics has been the conductive lead structures by which resistance variations of the MR film have been sensed. The conductive lead structures have comprised the well-known low resistivity materials which are good electrical conductors. For example, U.S. Pat. No. 4,622,613 to Nomura, et al. describes an MR sensor in which the conductive lead structures are formed of copper, gold, and silver. U.S. Pat. No. 4,663,684 to Kamo, et al. describes an MR sensor in which the conductive lead structures are formed of gold or aluminum.

Other conductive lead structures have utilized multilayer configurations. U.S. Pat. No. 4,503,394 discloses an MR sensor in which the conductive lead structure are formed of a two-layer assembly in which the first layer is made from a material selected from the group consisting of Cr, Mo, and Ti and the second layer is made from a material selected from the group consisting of Al, Au, Pt and Pd. U.S. Pat. No. 4,914,538 discloses an MR sensor having a lead structure comprising a thin film of tungsten having a thin film overlayer, or, alternatively, a thin film overlayer and a thin film underlayer, with both the thin film overlayer and the thin film underlayer formed of a material taken from the group consisting of Ti, Ta, Cr, Zr, Hf and TiW.

In the MR conductor lead application, the materials face much more stringent requirements when compared to other interconnect conductors, such as for semiconductor devices, for example. This is because the conductor lead is exposed at the slider air bearing surface and therefore has little protection from the severe mechanical environment where head-disk contact occurs frequently and the severe corrosion environment where chemical attack occurs both during processing and also in actual use where the environment may not be well controlled.

What is required in the MR conductor lead application is a structure which has not only low resistivity but also excellent resistance to corrosion and which maintains these characteristics without change for an extended period of usage.

SUMMARY OF THE INVENTION

It is therefore the principal object of this invention to provide conductive lead structures for a magnetoresistive (MR) sensor which have suitable characteristics which remain stable not only during subsequent processing of the MR sensor but also over the useful life of the sensor.

In accordance with the principles of the present invention, a magnetoresistive (MR) read transducer assembly comprises a thin film layer of MR material, and a plurality of electrically conductive lead structures, each of the electrically conductive lead structures electrically contacting the thin film layer of MR material at spaced positions. The lead structures comprise a thin film of a body-centered-cubic tantalum separated from the thin film of MR material by a thin film seed layer. The seed layer is formed of a material taken from the group consisting an alloy of titanium and tungsten, an alloy of tantalum and tungsten, chromium and tungsten.

The foregoing and other objects, features and advantages of the invention will be apparent from the following more particular description of a preferred embodiment of the invention as illustrated in accompanying drawings.

DESCRIPTION OF THE PREFERRED EMBODIMENT

Figure 1:
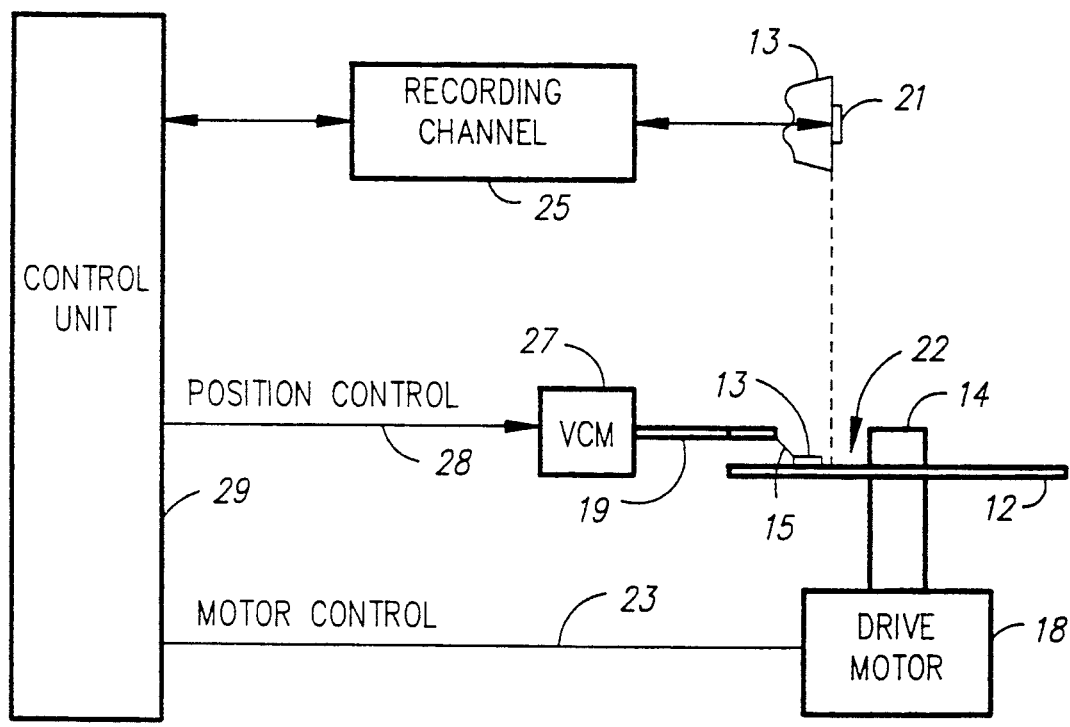
FIG. 1 is a simplified block diagram of a magnetic disk storage system embodying the present invention.

Although the present invention is described as embodied in a magnetic disk storage system as shown in FIG. 1, it will be apparent that the invention is also applicable to other magnetic recording systems such as a magnetic tape recording system, for example. At least one rotatable magnetic disk 12 is supported on a spindle 14 and rotated by a disk drive motor 18. The magnetic recording media on each disk is in the form of an annular pattern of concentric data tracks (not shown) on disk 12.

At least one slider 13 is positioned on the disk 12, each slider 13 supporting one or more magnetic read/write heads 21. As the disks rotate, the sliders 13 are moved radially in and out so that the heads 21 may access different portions of the disk surface 22 containing the data. Each slider 13 is attached to an actuator arm 19 by means of a suspension 15. The suspension 15 provides a slight spring force which biases the slider 13 against the disk surface 22. Each actuator arm 19 is attached to an actuator means 27. The actuator means shown in FIG. 1 is a voice coil motor (VCM). The VCM is a coil moveable within a fixed magnetic field, and the direction and velocity of the coil movements is controlled by the current supplied.

During operation of the disk storage system, the rotation of the disk 12 generates an air bearing between the slider 13 and the disk surface 22. The air bearing thus counterbalances the slight spring force of the suspension 15 and supports the slider 13 off the disk surface by a small, substantially constant spacing during operation.

The various components of the disk storage system are controlled in operation by signals generated by control unit 29, such as access control signals and internal clock signals, and which includes logic control circuits, storage means and a microprocessor. The control unit 29 generates control signals to control various system operations such as motor control signals on line 23 and head position control signals on line 28. The control signals on line 28 provide the desired current profiles to optimally move and position a selected slider 13 to the desired data track on the associated disk 12. Read and write signals are communicated to and from read/write heads 21 by means of recording channel 25.

The above description of a typical magnetic disk storage system, and the accompanying illustration of it in FIG. 1 are for representation purposes only. It should be apparent that disk storage systems may contain a large number of disks and actuators, and each actuator may support a number of sliders.

Figure 2:
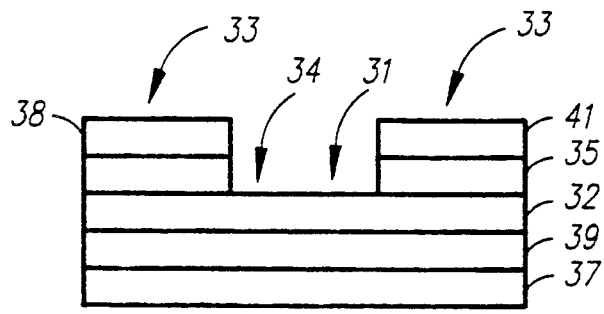
FIG. 2 is an end view of a specific embodiment of an MR read transducer assembly embodying the present invention.

A specific embodiment of a magnetoresistive read transducer assembly will be described briefly in conjunction with FIG. 2. The magnetic read head utilizes a magnetoresistive (MR) sensor 31 produced on a suitable substrate (not shown). The MR sensor 31 can be divided into two regions, the central active region 34, where actual sensing of data is accomplished, and end regions 33. The two regions 33, 34 should be biased in different manners with longitudinal bias only in the end regions 33 and transverse bias in the active region 34. The longitudinal bias in the end regions 33 is produced by bias layer 35 which is deposited to be in direct physical contact with MR layer 32. Bias layer 35 may comprise either an antiferromagnetic material or a hard magnetic material. The transverse bias in the active region 34 is produced by a soft magnetic film layer 37 which is separated from the MR layer 32 by a thin nonmagnetic spacer layer 39 whose purpose is to prevent, within the active central region, a magnetic exchange coupling between the MR layer 32 and the soft magnetic bias layer 37. The distance between the inner edges of conductive lead structures 38 and 41 (as shown in FIG. 3) comprise the portion of the active region 34 over which the output signal is sensed.

Figure 3:
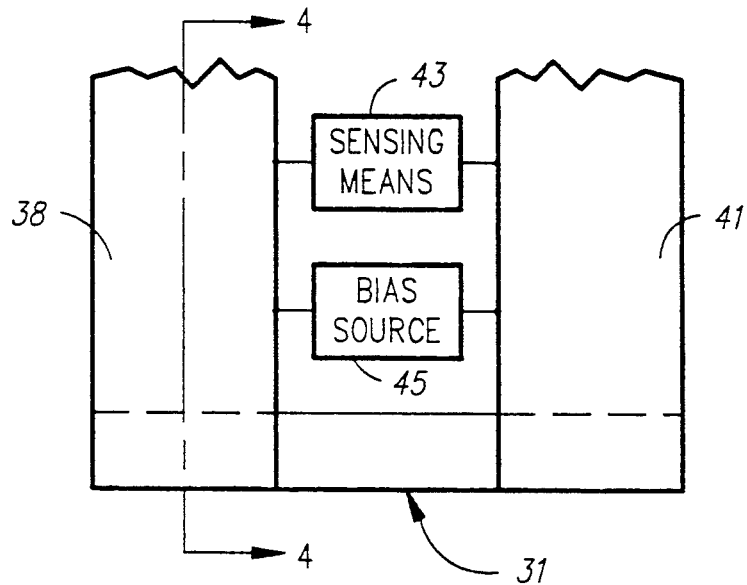
FIG. 3 is a plan view of the transducer shown in FIG. 2.

With reference now to FIG. 3, an output signal is, can be coupled out to sensing means 43, with the aid of conductive lead structures 38 and 41 which are electrically connected to the MR sensor 31. The signal is enables the sensing means 43 to determine the resistance changes in the active region 34 as a function of the magnetic fields which are intercepted by the MR sensor 31 from previously recorded data on a magnetic medium, for example. A bias source 45 is also connected to conductive lead structures 38 and 41 to supply a bias current which, in conjunction with soft magnetic bias film layer 37, produces the transverse bias in the active regions 34 as is known in the art. Typically, sensing means 43 and bias source 45 may be incorporated in the read/write channel circuitry 25 (as shown in FIG. 1).

According to the present invention, the principal current carrying element of the conductive lead structures 38 and 41 is low resistivity tantalum (Ta). The low resistivity phase of Ta is the body-centered-cubic (BCC) form of Ta known as alpha phase Ta and has a bulk resistivity of about 13 micro-ohm-cm at 300 degrees K. The resistivity of alpha phase Ta is within a range that is suitable for use as the conductive lead structure for an MR sensor. In addition, Ta has other characteristics which make it suitable for the conductive lead structure of an MR sensor. These characteristics include a high resistance to electromigration, corrosion and dynamic scratching. Tantalum is also low cost, readily available and easily manufacturable in an MR lead application.

However, in thin film form, the characteristics of Ta can vary widely depending on a number of factors. One of these characteristics is the resistivity which can vary from a value of about 20 micro-ohm-cm for the low resistivity alpha phase to a value of about 200 micro-ohm-cm for the high resistivity tetragonal or beta phase while mixed phase Ta films can have a resistivity of some intermediate value. A resistivity of about 20 micro-ohm-cm for the thin film layers of alpha phase Ta is still within the range that is suitable for use as the conductive lead structure for an MR sensor. However the resistivity of about 200 micro-ohm-cm for the thin film layers of beta phase Ta is well outside this range and is unacceptable for use as the conductive lead structure for an MR sensor.

According to the present invention, it was found that the deposition in thin film form of low resistivity alpha phase Ta can be assured by providing a conforming substrate with similar BCC structure. This conforming substrate can be produced by the use of a thin seed layer of a suitable material such as a seed layer taken from the group consisting of an alloy of titanium (Ti) and tungsten (W), an alloy of Ta and W, chromium (Cr) and W.

Figures 4, 5:
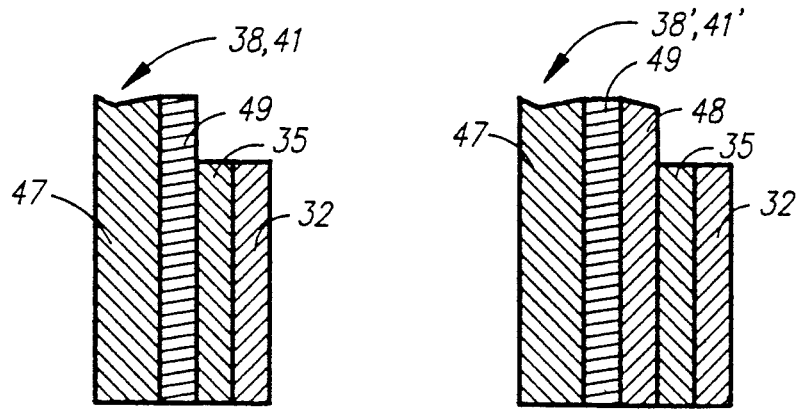
FIG. 4 is a partial section view taken along lines 4—4 of FIG. 3.
FIG. 5 is a partial section view taken along lines 4—4 of FIG. 3 of an alternate embodiment of an MR read transducer assembly according to the present invention.

A specific embodiment of the present invention is shown in FIG. 4 in which the conductive lead structures 38 and 41 comprise a thin film 47 of alpha phase Ta having a thickness within the range of 1000 to 5000Å as the principal current carrying member of the lead structure. To insure the formation of alpha phase Ta, a thin film seed layer 49 having a thickness within the range of 25 to 200Å is provided. The thin film seed layer 49 is formed of a material taken from the group consisting of TiW, TaW, Cr and W.

The resistivity of the resulting Ta films depends to an extent on the material utilized for the seed layer 49. In the case of the use of TiW as the seed layer material, a minimum of 8 percent Ti must be present to provide adequate corrosion resistance. In a specific embodiment in which the alpha Ta layer was about 1800Å thick and the TiW seed layer 49 was about 200Å thick, a resistivity within the range of 19–21 micro-ohm-cm was produced. In a further specific embodiment in which a TaW seed layer of the same thickness was used and in which the percent Ta was within the range of 50 to 80 percent by weight, a resistivity within the range of 19–21 micro-ohm-cm was observed. When the seed layer was W, a resistivity within the range of 20–24 micro-ohm-cm was observed.

In some cases, depending upon the materials being used, a thin film diffusion barrier may be required prior to the deposition of the seed layer. A specific embodiment of such a lead structure 38' is shown in FIG. 5. For example, if the seed layer 49 is Cr, a thin diffusion barrier 48 of Ta is deposited prior to the deposition of the Cr seed layer 49.

Since elevated temperatures, up to 250° C., for example, are encountered in various processing steps for the MR sensor, a further requirement is that the resistivity of the lead structure remain stable in the presence of the subsequent thermal processing. In addition, the lead structure must exhibit sufficient mechanical stability to withstand occasional contact with the disk and chemical stability to withstand the corrosive environment that may occur in the operating lifetime of a disk file in which the MR sensor is installed. Since both TaW and TiW exhibit excellent corrosion resistance and high mechanical strength, as well as having the required BCC structure to stabilize the low resistivity Ta BCC structure, they are preferred materials for use as seed layer 49 to stabilize the BCC Ta lead structure 38, 41.

An MR lead structure has been described, according to the present invention, which remains stable not only during subsequent processing of the MR sensor during manufacturing but also during the anticipated useful life of the MR sensor in an operational disk file.

While the invention has been particularly shown and described with reference to a preferred embodiment thereof, it will be understood by those skilled in the art that various other changes in the form and details may be made therein without departing from the spirit and scope of the invention.

We claim:

1. A magnetic sensor comprising:
   a layer of magnetoresistive material formed on a substrate; and
   a plurality of electrically conductive lead structures electrically contacting said layer of magnetoresistive material at spaced positions, each said electrically conductive lead structure comprising a layer of body-centered-cubic tantalum separated from said magnetoresistive material by a seed layer, said seed layer being of a material having a body-centered-cubic structure, said seed layer of a material selected from the group consisting of an alloy of tantalum and tungsten, an alloy of titanium and tungsten, chromium and tungsten, the thickness of said layer of tantalum being in the range of 1000–5000 angstroms, the thickness of said seed layer being in the range of 25–200 angstroms, said layer of tantalum and said seed layer being coextensive in said lead structures whereby, when a signal output means is connected between two of said electrically conductive lead structures, resistances changes in said magnetoresistive material responsive to magnetic fields which are intercepted by said layer of magnetoresistive material can be detected.

2. The magnetic sensor as in claim 1 wherein the weight percent of titanium in said alloy of titanium and tungsten is at least 8 percent.

3. The magnetic sensor as in claim 1 wherein the weight percent of tantalum in said alloy of tantalum and tungsten is within the range of 50 to 80 percent.

4. The magnetic sensor as in claim 1 additionally comprising a diffusion barrier layer between said seed layer and aid layer of magnetoresistive material.

5. A magnetic storage system comprising:
   a magnetic storage medium having a plurality of tracks for recording of data;
   a magnetic transducer maintained in a closely spaced position relative to said magnetic storage medium during relative movement between said magnetic transducer and said magnetic storage medium said magnetic transducer further comprising:
   a layer of magnetoresistive material formed on a substrate; and
   a plurality of electrically conductive lead structures electrically contacting said layer of magnetoresistive material at spaced positions, each said lead structure comprising a layer of body-centered-cubic tantalum separated from said magnetoresistive material by a seed layer, said seed layer being of a material having a body-centered-cubic structure, said seed layer of a material selected from the group consisting of an alloy of tantalum and tungsten, an alloy of titanium and tungsten, chromium and tungsten, the thickness of said layer of tantalum being in the range of 1000–5000 angstroms, the thickness of said seed layer being in the range of 25–200 angstroms, said tantalum layer and said seed layer being coextensive in said lead structures;
   actuator means coupled to said magnetic transducer for moving said magnetic transducer to selected tracks on said magnetic storage medium; and
   means coupled between two of said electrically conductive lead structures for detecting resistance changes in said magnetoresistive material responsive to magnetic fields representative of data bits recorded in said magnetic storage medium intercepted by said layer of magnetoresistive material.

6. The magnetic storage system as in claim 5 wherein the weight percent of titanium in said alloy of titanium and tungsten is at least 8 percent.

7. The magnetic storage system as in claim 5 wherein the weight percent of tantalum in said alloy of tantalum and tungsten is within the range of 50 to 80 percent.

8. The magnetic storage system as in claim 5 additionally comprising a diffusion barrier layer between said seed layer and said layer of magnetoresistive material.

* * * * *

UNITED STATES PATENT AND TRADEMARK OFFICE
CERTIFICATE OF CORRECTION

PATENT NO. : 5,268,806
DATED : December 7, 1993
INVENTOR(S) : Goubau et al.

It is certified that error appears in the above-indentified patent and that said Letters Patent is hereby corrected as shown below:

Column 3, line 44, delete "$i_S$", insert -- $i_s$ --.

Column 3, line 47, delete "is", insert -- $i_s$ --.

Signed and Sealed this

Ninth Day of May, 1995

Attest:

BRUCE LEHMAN

Attesting Officer    Commissioner of Patents and Trademarks